United States Patent
Taguchi

(10) Patent No.: US 6,674,160 B1
(45) Date of Patent: Jan. 6, 2004

(54) MULTI-CHIP SEMICONDUCTOR DEVICE

(75) Inventor: Kazuhiro Taguchi, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/526,904

(22) Filed: Mar. 16, 2000

(30) Foreign Application Priority Data

Mar. 18, 1999 (JP) .............................. 11-073689

(51) Int. Cl.[7] .............................................. H01L 23/02
(52) U.S. Cl. ........................ 257/686; 257/682; 257/704; 257/712
(58) Field of Search ............................... 257/686, 678, 257/682, 684, 685, 704, 712

(56) References Cited

U.S. PATENT DOCUMENTS

| | | | | |
|---|---|---|---|---|
| 5,151,771 A | * | 9/1992 | Hiroi et al. ................ | 257/666 |
| 5,172,303 A | * | 12/1992 | Bernardoni et al. ........ | 174/52.4 |
| 5,739,581 A | * | 4/1998 | Chillara et al. ............ | 257/668 |
| 5,963,430 A | * | 10/1999 | Londa ........................ | 257/686 |

FOREIGN PATENT DOCUMENTS

| | | |
|---|---|---|
| JP | 64-89356 | 4/1989 |
| JP | 4-40546 | 4/1992 |
| JP | 04-354361 | 12/1992 |
| JP | 5-82710 | 4/1993 |
| JP | 08-032183 | 2/1996 |
| JP | 8-250651 | 9/1996 |
| JP | 09-008220 | 1/1997 |
| JP | 10-084076 | 3/1998 |

* cited by examiner

*Primary Examiner*—Nathan J. Flynn
*Assistant Examiner*—Leonardo Andújar
(74) *Attorney, Agent, or Firm*—Katten Muchin Zavis Rosenman

(57) ABSTRACT

There is provided a semiconductor device including (a) a package comprised of a base, a sidewall standing on the base at a periphery of the base, and a cover mounted over the sidewall, the base, sidewall and cover defining a closed adiabatic space in the package, (b) a first semiconductor chip mounted on the base in the close adiabatic space, and (c) a second semiconductor chip mounted on the cover. The semiconductor device makes it possible to prevent heat generated in an upper semiconductor chip from being transferred to a lower semiconductor chip, and more highly integrate semiconductor chips than a conventional one.

15 Claims, 6 Drawing Sheets

US 6,674,160 B1

MULTI-CHIP SEMICONDUCTOR DEVICE

BACKGROUND OF THE INVENTION

1. Field of the Invention

The invention relates to a semiconductor device and a method of fabricating the same, and more particularly to a semiconductor device capable of being integrated more highly than a conventional one and a method of fabricating such a semiconductor device.

2. Description of the Related Art

A conventional semiconductor device is generally designed to include a plurality of semiconductor chips two-dimensionally arranged on a substrate. FIG. 1 is a side view illustrating such a conventional semiconductor device.

The illustrated semiconductor device is comprised of a substrate 20 on which wirings are formed in a predetermined pattern, TAB (Tape Automated Bonding) tapes 25 on each of which a first LSI chip 40A and a second LSI chip 40B is mounted, respectively, bonding wires BW electrically connecting bonding pads of the first and second LSI chips 40A and 40B to electrically conductive leads of TAB tapes 25, resin 26 covering the first and second LSI chips 40A and 40B and the bonding wires BW on the TAB tapes 25, and solder balls 29 electrically connecting the TAB tapes 25 to the substrate 20.

The above-mentioned conventional semiconductor device attempts to achieve higher integration by two-dimensionally arranging a plurality of LSI chips. However, since the substrate 20 has a limited size, it would be impossible to much increase the number of LSI chips to be arranged on the substrate 20, resulting in difficulty in higher integration of LSI chips.

To solve this problem, Japanese Unexamined Patent Publications Nos. 10-84076, 8-32183 and 9-8220 have suggested a semiconductor device for achieving higher integration.

For instance, the semiconductor device suggested in Japanese Unexamined Patent Publication No. 10-84076 is designed to include a first package in which a first LSI chip is sealed, and a second package in which a second LSI chip is sealed and which is vertically stacked on the first package. The first and second LSI chips are electrically connected to a substrate through ball grid arrays (BGA) and electrically conductive leads of an auxiliary substrate.

However, the above-mentioned semiconductor device suggested in Japanese Unexamined Patent Publication No. 10-84076 is accompanied with the following problem. Since the above-mentioned semiconductor device is intended to be as small as possible in size, a gap between the first and second LSI chips is quite small. In addition, the gap is filled with resin. As a result, path through which heat generated in the second or upper LSI chip is radiated is not sufficiently ensured, resulting in that heat generated in the second or upper LSI chip is transferred to the first or lower LSI chip through the resin filling the gap therewith. The thus transferred heat prevents proper operation of the first or lower LSI chip.

SUMMARY OF THE INVENTION

In view of the above-mentioned problem of the conventional semiconductor device, it is an object of the present invention to provide a semiconductor device which is capable of preventing heat generated in an upper semiconductor chip from transferring to a lower semiconductor chip.

It is also an object of the present invention to provide a method of fabricating such a semiconductor device.

In one aspect of the present invention, there is provided a semiconductor device including (a) a package defining a closed adiabatic space therein, (b) a first semiconductor chip arranged in the closed adiabatic space, and (c) a second semiconductor chip mounted on the package.

There is further provided a semiconductor device including (a) a package comprised of a base, a sidewall standing on the base at a periphery of the base, and a cover mounted over the sidewall, the base, sidewall and cover defining a closed adiabatic space in the package, (b) a first semiconductor chip mounted on the base in the close adiabatic space, and (c) a second semiconductor chip mounted on the cover.

In accordance with the above-mentioned semiconductor device, semiconductor chips can be highly integrated by vertically arranging them, and in addition, the closed adiabatic space formed between the first and second semiconductor chips solves the problem that heat generated in the second semiconductor chip is transferred to the first semiconductor chip, ensuring proper operation of the first semiconductor chip.

In a preferred embodiment, each of the base and the cover is comprised of a printed wiring board.

In accordance with the embodiment, signals transmitted from the first and second semiconductor chips can be readily transmitted outside the package.

In a preferred embodiment, the cover is comprised of a metal plate.

In accordance with the embodiment, it would be possible to enhance heat-radiation characteristic of the second semiconductor chip mounted on the cover.

In a preferred embodiment, when the base is formed therein with a first wiring terminal appearing at an upper surface of the base, and the sidewall is formed therein with a second wiring terminal appearing at a lower surface of the sidewall, the semiconductor device further includes a solder ball located between the base and the sidewall, the first and second wiring terminals being electrically connected to each other through the solder ball.

In accordance with the embodiment, it would be possible to surely electrically connect the base to the sidewall.

In a preferred embodiment, when the sidewall is formed therein with a wiring terminal appearing at an upper surface of the sidewall, the semiconductor device further includes a bonding wire through which the second semiconductor chip is electrically connected to the wiring terminal. The bonding wire may be covered with resin on the cover.

In a preferred embodiment, when the base is formed therein with a wiring terminal appearing at an upper surface of the base, the semiconductor device further includes a bonding wire through which the first semiconductor chip is electrically connected to the wiring terminal. The bonding wire may be bent in the closed adiabatic space.

In another aspect of the present invention, there is provided a semiconductor device including (a) a plurality of packages vertically stacked one on another, each of the packages defining a closed adiabatic space therein, and (b) a plurality of semiconductor chips each arranged in the closed adiabatic space of each of the packages.

There is further provided a semiconductor device including (a) a plurality of packages vertically stacked one on another, each of the packages being comprised of a base, a sidewall standing on the base at a periphery of the base, and a cover mounted over the sidewall, the base, sidewall and cover defining a closed adiabatic space in each of the packages, and (b) a plurality of semiconductor chips each arranged in the closed adiabatic space of each of the packages.

In a preferred embodiment, when the base is formed therein with a first wiring terminal appearing at an upper surface of the base, and the sidewall is formed therein with a second wiring terminal appearing at a lower surface of the sidewall, the semiconductor device further includes solder balls each located between the base and the sidewall, the first and second wiring terminals being electrically connected to each other through each of the solder balls.

In a preferred embodiment, when the sidewall is formed therein with a wiring terminal appearing at an upper surface of the sidewall, the semiconductor device further includes bonding wires through each of which a semiconductor chip mounted on a package which the sidewall partially constitutes is electrically connected to the wiring terminal.

In a preferred embodiment, when the base is formed therein with a wiring terminal appearing at an upper surface of the base, the semiconductor device further includes a bonding wire through which a semiconductor chip mounted in a package which the base partially constitutes is electrically connected to the wiring terminal.

In another aspect of the present invention, there is provided a method of fabricating a semiconductor device, including the steps of (a) mounting a first semiconductor chip on a first substrate, (b) mounting a sidewall on the first semiconductor chip so that the first semiconductor chip is located within an opening formed through the sidewall, (c) mounting a cover over the sidewall so that a space defined by the first semiconductor substrate, the sidewall and the cover is a closed adiabatic space, (d) mounting a second semiconductor chip on the cover.

The step (b) may be carried out prior to the step (a). As an alternative, the steps (a) and (b) may be concurrently carried out.

There is further provided a method of fabricating a semiconductor device, including the steps of (a) mounting a first semiconductor chip on a first substrate, (b) mounting a sidewall on the first semiconductor chip so that the first semiconductor chip is located within an opening formed through the sidewall, (c) mounting a second substrate over the sidewall so that a space defined by the first semiconductor substrate, the sidewall and the second substrate is a closed adiabatic space, (d) mounting a second semiconductor chip on the second substrate, and (e) repeating the steps (b) to (d) desired number of times.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

Figure 1:
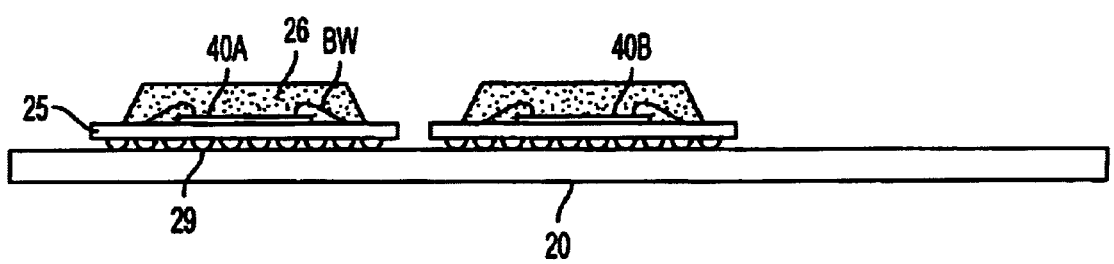
FIG. 1 is a cross-sectional view of a conventional semiconductor device mounted on a substrate.
Figure 2:
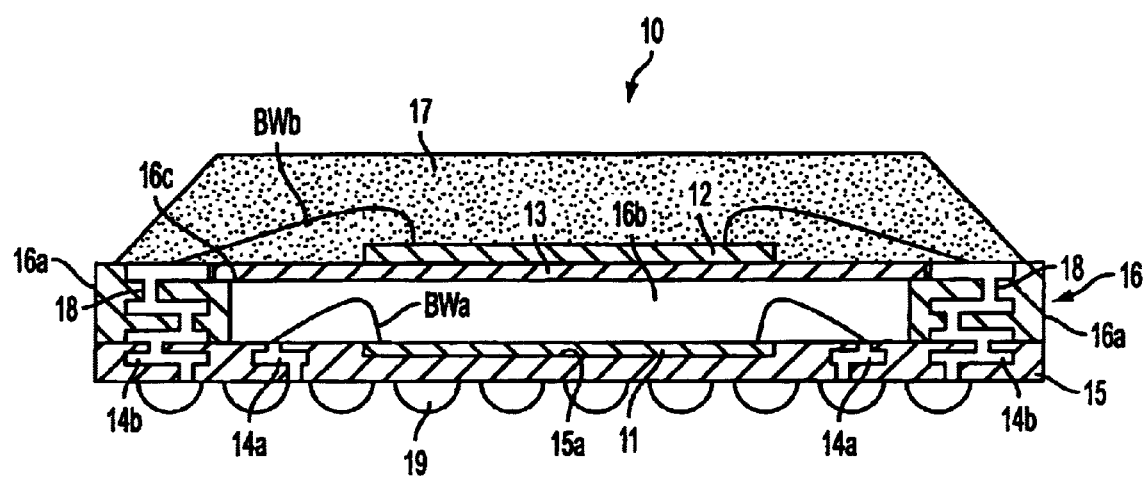
FIG. 2 is a cross-sectional view of a semiconductor device in accordance with the first embodiment.

FIG. 2 illustrates a semiconductor device in accordance with the preferred embodiment of the present invention.

The semiconductor device 10 is comprised of a package, a lower LSI chip 11 enclosed in the package, an upper LSI chip 12 mounted on the package, resin 17 deposited on the package to thereby cover the upper LSI chip 12 therewith, and a plurality of solder balls 19 arranged at a bottom of the package.

The package is comprised of a base 15 on which the lower LSI chip 11 is mounted, a frame-shaped sidewall 16a standing on the base 15 at a periphery of the base 15 and having an inner space in which the lower LSI chip 11 is surrounded, and a rectangular cover 13 mounted over the sidewall 16a and entirely covering the inner space of the sidewall 16a therewith.

The base 15 is comprised of a lower multi-layered wiring board, the sidewall 16a is comprised of a frame-shaped upper multi-layered wiring board.

The base or lower multi-layered wiring board 15 is centrally formed at a surface thereof with a rectangular recess 15a into which the lower LSI chip 11 is to be fit. A plurality of the solder balls 19 are arranged in a matrix on a lower surface of the base 15 for outwardly directing signals transmitted from the lower and upper LSI chips 11 and 12.

The base or lower multi-layered wiring board 15 is composed of plastic and is formed therein with a plurality of electrically conductive first and second leads 14a and 14a. The first leads 14a are located closer to the recess 15a than the second leads 14b, and have opposite ends both appearing at upper and lower surfaces of the base 15. The second leads 14b are located remoter from the recess 15a than the first leads 14a, and have opposite ends both appearing at upper and lower surfaces of the base 15. Each one of the first and second leads 14a and 14b is electrically connected to an associated solder ball 19 at a lower surface of the base 15.

The lower LSI chip 11 fit into the recess 15a is electrically connected at bonding pads thereof (not illustrated) to the associated first leads 14a through bonding wires BWa.

The upper multi-layered wiring board 16 is composed of plastic, and is in the form of a rectangular frame. The upper multi-layered wiring board 16 is formed therein with a plurality of electrically conductive third leads 18. The third leads 18 have opposite ends both appearing at upper and lower surfaces of the upper multi-layered wiring board 16.

The lower multi-layered wiring board 15, the upper multi-layered wiring board 16 and the cover 13 cooperate with one another to define a closed adiabatic space 16b. The sidewall 16a is formed at an upper inner edge with a stepped portion 16c at which the cover 13 is supported.

Figure 5:
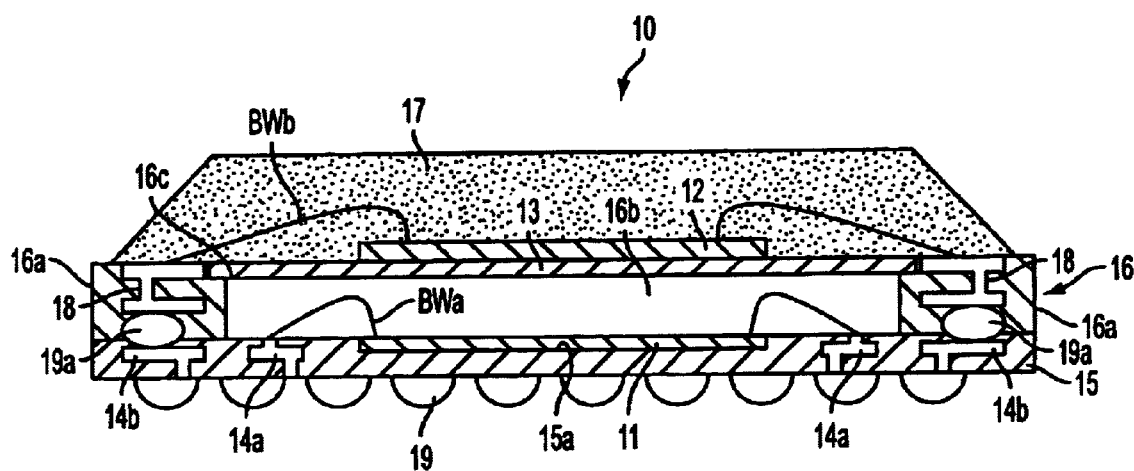
FIG. 5 is a cross-sectional view of the embodiment of FIG. 2 further illustrating aspects relating to the electrical interconnection of lower and upper multi-layered wiring boards of the device.

As illustrated, for example, in FIG. 5, third leads 18 and the second leads 14b are electrically connected to each other through solder balls 19a, for instance. The lower multi-layered wiring board 15 can be electrically readily connected to the upper multi-layered wiring board 16 through the use of such solder balls. wiring board 15 by arranging the solder balls therebetween. Such a gap is filled with resin.

The first to third leads 14a, 14b and 18 are composed of electrically conductive material such as copper (Cu) or gold (Au), and are formed by filling such electrically conductive material in through-holes vertically formed through the lower and upper multi-layered wiring boards 15 and 16.

The cover 13 is composed of electrically conductive material such as metal. The upper LSI chip 12 is mounted centrally on the cover 13. Since the upper LSI chip 12 is mounted on such electrically conductive material, for instance, metal, it is possible to facilitate radiation of heat generated in the upper LSI chip 12.

The upper LSI chip 12 is electrically connected at bonding pads thereof (not illustrated) to the associated third wiring leads 18 through bonding pads BWb. The upper LSI chip 12 and the bonding wires BWb are both covered in the resin 17 molded on the cover 13.

Figure 3:
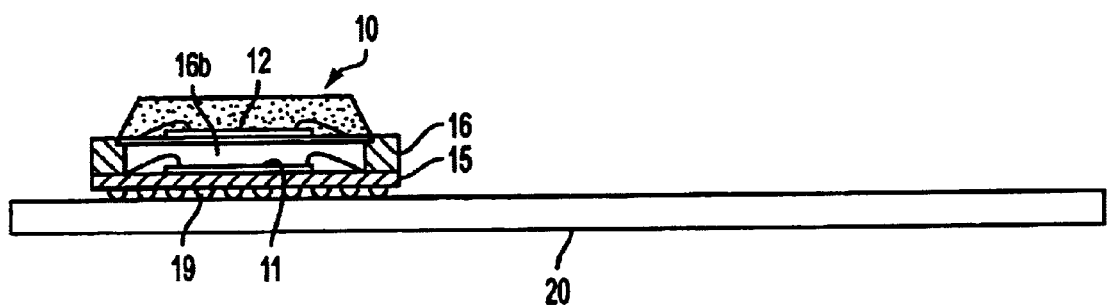
FIG. 3 is a cross-sectional view of the semiconductor device illustrated in FIG. 2, mounted on a substrate.

FIG. 3 illustrates that the semiconductor device 10 illustrated in FIG. 2 is mounted on a substrate. The semiconductor device 10 is mounted on and electrically connected to a substrate 20 on which wirings are formed in a predetermined pattern. Though not illustrated, other semiconductor devices each having the same structure as that of the semiconductor device 10 are arranged also on the substrate 20 to thereby achieve higher integration of semiconductor devices.

Figure 4:
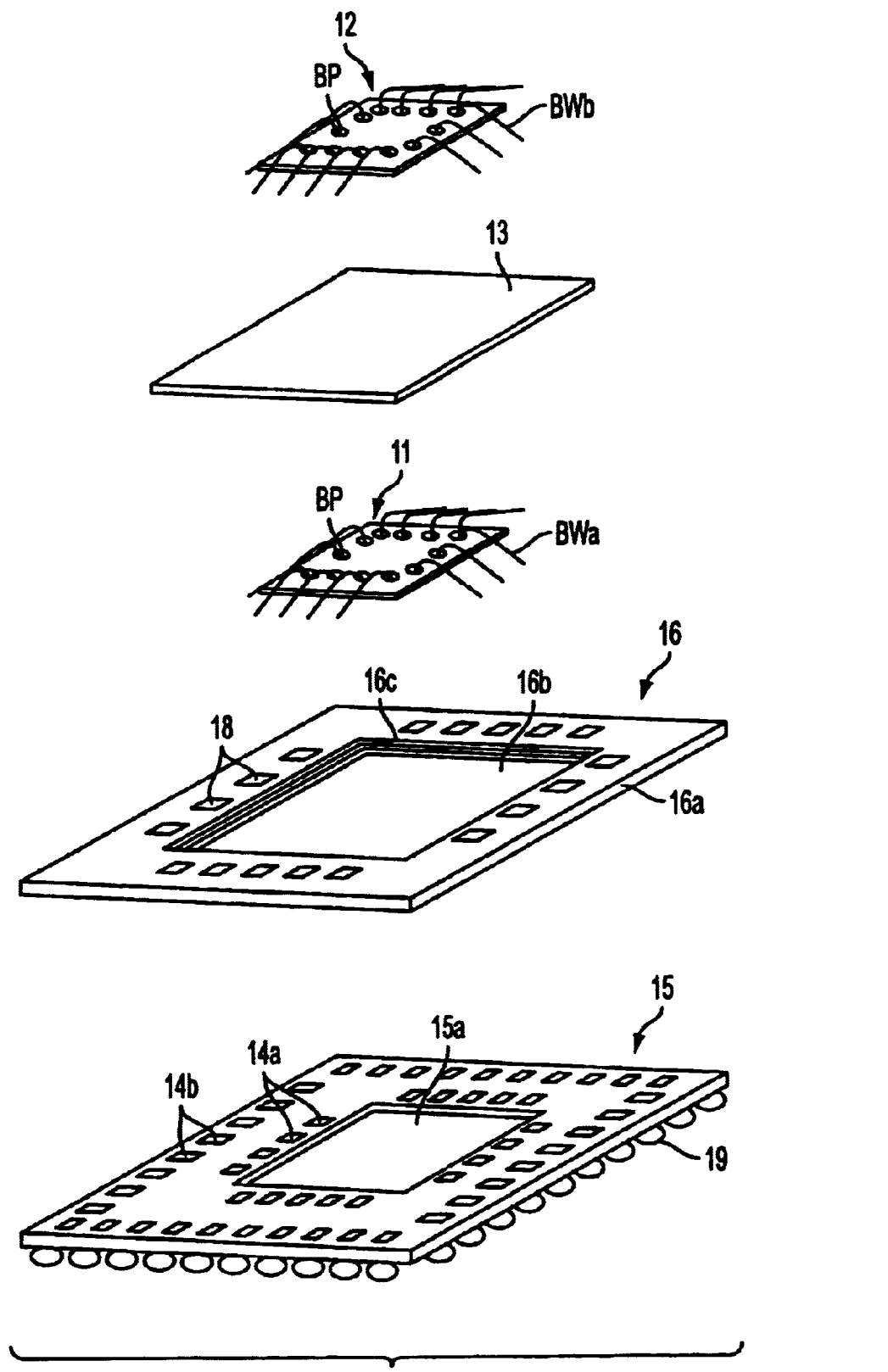
FIG. 4 is an exploded perspective view of the semiconductor device illustrated in FIG. 2.

FIG. 4 is an exploded perspective view of the semiconductor device 10 illustrated in FIG. 2. Hereinbelow is explained a method of fabricating the semiconductor device 10, with reference to FIG. 4.

First, the lower LSI chip 11 is fit into the recess 15a formed at a surface of the lower multi-layered wiring board 15. Then, the lower LSI chip 11 is electrically connected at bonding pads BP thereof to the first leads 14a of the lower multi-layered wiring board 15 through the bonding wires BWa.

Then, the upper multi-layered wiring board 16 is mounted on the lower multi-layered wiring board 15 with the lower LSI chip 11 being located in the space 16b, and the third leads 18 are electrically connected to the second leads 14b through solder balls (not illustrated).

Then, a gap formed between the sidewall 16a and the lower multi-layered wiring board 15 is filled with resin, which is then cured.

It should be noted that the step of fitting the lower LSI chip 11 into the recess 15a of the lower multi-layered wiring board 15 may be carried out before or after the step of fixing the upper multi-layered wiring board 16 on the lower multi-layered wiring board 15.

Then, the cover 13 is fit in the stepped portion 16c of the upper multi-layered wiring board 16, and is caused to electrically connect to ground terminals (not illustrated) formed on the upper multi-layered wiring board 16. Thus, the sidewall 16a, the lower multi-layered wiring board 15 and the cover 13 define the closed adiabatic space 16b in which the bonding wires BWa electrically connecting the lower LSI chip 11 to the first leads 14a are sufficiently accommodated, even if the bonding wires BWa are bent.

Then, the upper LSI chip 12 is fixed on the cover 13 at a center of the cover 13, and is electrically connected at bonding pads BP thereof to the third leads 18 of the upper multi-layered wiring board 16.

Then, the resin 17 is deposited on the cover 13 so that the resin 17 entirely covers the cover 13, the upper multi-layered wiring board 16, the upper LSI chip 12 and the bonding wires BWb therewith, and is cured in a trapezoidal form. Thus, the upper LSI chip 12 and the bonding wires BWb are sealed in the resin 17.

Thus, there is completed the semiconductor device 10 in which the lower LSI chip 11 is accommodated in the package and the upper LSI chip 12 is mounted on the package.

In accordance with the above-mentioned embodiment, the lower and upper LSI chips 11 and 12 are vertically arranged. Thus, the semiconductor device in accordance with the above-mentioned embodiment could have an area equal to about a half of an area of a semiconductor device in which two LSI chips are two-dimensionally arranged. As a result, it is possible to reduce an area occupied by the semiconductor device 10 on the substrate 20, ensuring higher integration of semiconductor devices.

In addition, the closed adiabatic space 16b prevents heat generated in the upper LSI chip 12 from being transferred to the lower LSI chip 11, ensuring proper operation of the lower LSI chip 11.

Figure 6:
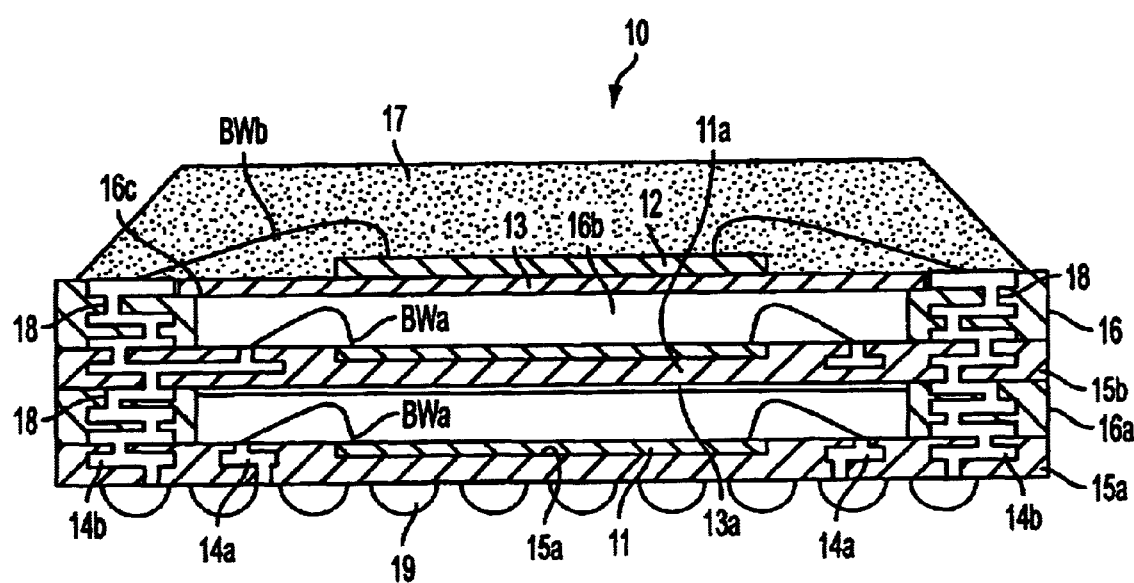
FIG. 6 is a cross-sectional view of a semiconductor device in accordance with a second embodiment comprising three LSI chips.

Though the semiconductor device 10 in accordance with the above-mentioned embodiment is designed to include two LSI chips 11 and 12 vertically arranged, it should be noted that the semiconductor device 10 may be designed to include three or more LSI chips vertically arranged, in which case, a plurality of the packages each defined by the lower multi-layered wiring board 15, the upper multi-layered wiring board 16 and the cover 13 are vertically stacked. As illustrated in FIG. 6, in such a semiconductor device, a cover 13a in a first package may constitute a portion of a base 15b of a second package located immediately above the first package. Intermediate LSI chip 11a may be electrically interconnected to solder balls 19 via circuit paths in bases 15a, b and sidewalls 16a. Uppermost LSI chip 12 may be interconnected to solder balls 19 via circuit paths in sidewalls 16c, bases 15a, b and sidewalls 16a. The solder balls 19 are arranged only on a lower surface of a lower multi-layered wiring board 15a located lowermost, and the resin 117 is deposited only on a cover of a package located uppermost.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-73689 filed on Mar. 18, 1999 including specification, claims, drawings and summary is incorporated herein by reference in its entirety.

What is claimed is:

1. A semiconductor device comprising:
    (a) a package defining a closed space therein, wherein said package has a surface defining a first boundary of the closed space, said surface including a recess;
    (b) a first semiconductor chip mounted in the recess adjacent to said closed space; and
    (c) a second semiconductor chip mounted on said package above the closed space;
    wherein said closed space is configured to prevent transfer of substantially all heat generated by the second semiconductor chip to the first semiconductor chip.

2. A semiconductor device comprising:
    (a) a package comprised of a base, a sidewall standing on said base at a periphery of said base, and a cover mounted over said sidewall, said base, sidewall and cover defining a closed space in said package;

(b) a first semiconductor chip mounted in a recess in said base adjacent to said closed space; and (d) a second semiconductor chip mounted on said cover;

wherein said closed space is configured to prevent transfer of substantially all heat generated by the second semiconductor chip to the first semiconductor chip.

3. The semiconductor device as set forth in claim 2, wherein each of said base and said cover is comprised of a printed wiring board.

4. The semiconductor device as set forth in claim 2, wherein said cover is comprised of a metal plate.

5. The semiconductor device as set forth in claim 2, wherein said base is formed therein with a first wiring terminal appearing at an upper surface of said base, and said sidewall is formed therein with a second wiring terminal appearing at a lower surface of said sidewall, said semiconductor device further comprising a solder ball located between said base and said sidewall, said first and second wiring terminals being electrically connected to each other through said solder ball.

6. The semiconductor device as set forth in claim 2, wherein said sidewall is formed therein with a wiring terminal appearing at an upper surface of said sidewall, said semiconductor device further comprising a bonding wire through which said second semiconductor chip is electrically connected to said wiring terminal.

7. The semiconductor device as set forth in claim 2, wherein said base is formed therein with a wiring terminal appearing at an upper surface of said base, said semiconductor device further comprising a bonding wire through which said first semiconductor chip is electrically connected to said wiring terminal.

8. The semiconductor device of claim 2, wherein said cover is substantially made from an electrically conductive material.

9. The semiconductor device of claim 8, wherein the material is a metal.

10. A semiconductor device comprising:

(a) a plurality of packages vertically stacked on one another, each of said packages being comprised of a base, a sidewall standing on said base at a periphery of said base, and a cover mounted over said sidewall, said base, sidewall and cover defining a closed space in each of said packages; and (b) a plurality of semiconductor chips each mounted in the recess in the base of one of said packaged adjacent to the closed space defined in the package;

wherein each closed space is configured to prevent transfer of substantially all heat generated by ones of the plurality of semiconductor chips outside of the closed space to the semiconductor chip arranged in the closed space.

11. The semiconductor device as set forth in claim 10, wherein each of said base and said cover is comprised of a printed wiring board.

12. The semiconductor device as set forth in claim 10, wherein said cover is comprised of a metal plate.

13. The semiconductor device as set forth in claim 10, wherein said base is formed therein with a first wiring terminal appearing at an upper surface of said base, and said sidewall is formed therein with a second wiring terminal appearing at a lower surface of said sidewall, said semiconductor device further comprising solder balls each located between said base and said sidewall, said first and second wiring terminals being electrically connected to each other through each of said solder balls.

14. The semiconductor device as set forth in claim 10, wherein said sidewall is formed therein with a wiring terminal appearing at an upper surface of said sidewall, said semiconductor device further comprising bonding wires through each of which a semiconductor chip mounted on a package which said sidewall partially constitutes is electrically connected to said wiring terminal.

15. The semiconductor device as set forth in claim 10, wherein said base is formed therein with a wiring terminal appearing at an upper surface of said base, said semiconductor device further comprising a bonding wire through which a semiconductor chip mounted in a package which said base partially constitutes is electrically connected to said wiring terminal.

* * * * *